(12) United States Patent
Kim et al.

(10) Patent No.: US 11,387,788 B2
(45) Date of Patent: Jul. 12, 2022

(54) AMPLIFIER-EMBEDDED VIDEO SURVEILLANCE IP SPEAKER SYSTEM

(71) Applicant: Hyoung-Woo Kim, Bucheon-si (KR)

(72) Inventors: Hyoung-Woo Kim, Bucheon-si (KR); Young-Min Park, Seoul (KR)

(73) Assignees: Young-Min Park, Seoul (KR); Heyng-Il Kook, Yongin-si (KR)

( * ) Notice: Subject to any disclaimer, the term of this patent is extended or adjusted under 35 U.S.C. 154(b) by 143 days.

(21) Appl. No.: 17/026,459

(22) Filed: Sep. 21, 2020

(65) Prior Publication Data

US 2021/0211104 A1    Jul. 8, 2021

(30) Foreign Application Priority Data

Jan. 6, 2020   (KR) .................. 10-2020-0001489

(51) Int. Cl.
*H03F 3/183*   (2006.01)
*H03F 1/30*    (2006.01)
(Continued)

(52) U.S. Cl.
CPC .............. *H03F 3/183* (2013.01); *H03F 1/305* (2013.01); *H04R 1/02* (2013.01); *H04R 3/00* (2013.01); *H04R 2420/07* (2013.01)

(58) Field of Classification Search
CPC .............. H04R 2420/07; H04R 1/02; H04R 2227/003; H04R 27/00; H04R 3/00; H04R 17/02; H04R 1/08; H04R 1/2876; H04R 1/406; H04R 2201/021; H04R 2430/21; H04R 2430/23; H04R 29/005; H04R 31/006; H04R 3/005; H04R 3/04; H04R 2499/15; H04R 29/008; G10L 15/22; G10L 2021/02082; G10L 21/0232; H04M 3/4936; H04M 7/0066; H04M 7/0075;
(Continued)

(56) References Cited

U.S. PATENT DOCUMENTS 10,397,697 B2 * 8/2019 Lambert ............... H04R 1/2876
2003/0227540 A1 * 12/2003 Monroe ............ G08B 13/19684
                                                              348/14.02
(Continued)

FOREIGN PATENT DOCUMENTS

KR    10-1284234 B1    7/2013
KR    10-1928561 B1    12/2018
(Continued)

OTHER PUBLICATIONS

International Search Report dated Nov. 4, 2020 in counterpart International Application No. PCT/KR2020/009894 (3 pages in Korean).

(Continued)

*Primary Examiner* — Lun-See Lao
(74) *Attorney, Agent, or Firm* — Park, Kim & Suh, LLC

(57) ABSTRACT

An amplifier-embedded video surveillance IP speaker system is disclosed. The present disclosure includes an IP video device, an IP audio device, and a sensor, wherein audio data of a monitor agent using a remote user terminal is transmitted to an amplifier-embedded IP speaker having an assigned IP address to then be output, or wherein a remote control command is transmitted to an amplifier-embedded IP speaker, thereby outputting a warning sound.

11 Claims, 7 Drawing Sheets

(51) Int. Cl.
*H04R 1/02* (2006.01)
*H04R 3/00* (2006.01)

(58) Field of Classification Search
CPC ....... H04M 2201/40; H04M 2201/405; H04M 2207/12; H04M 3/2281; H04M 3/38; H04M 3/382; H04M 3/385; H04M 3/42; H04M 3/42017; H04M 3/42059; H04M 3/42068; H04M 3/42102; H04M 3/4211; H04M 3/42229; H04M 3/533; H04M 3/53383; H04M 7/06; H04M 7/12; H04N 7/15; H04N 7/181; H04N 5/2252; H04N 5/2254; H04N 5/23206; H04N 7/18; H04N 7/183; H04W 4/14; H04W 4/16; H04W 36/14; H04W 48/18; H04W 84/12; H04W 88/06; H04W 88/18; H04W 92/02; H04L 29/06; H04L 41/00; H04L 41/0816; H04L 41/0856; H04L 41/0873; H04L 67/025; H04L 69/325; H04L 12/10; H04L 65/00; H04L 67/12; H04L 67/2804; H04L 67/2842; H04L 67/289; H04Q 3/0029; H04Q 3/0045
USPC ................... 381/120, 1, 17–22, 119; 700/94; 348/739, 353, 355, 326, 328, 1–14.08, 348/14.1
See application file for complete search history.

(56) References Cited

U.S. PATENT DOCUMENTS

| | | | |
|---|---|---|---|
| 2008/0189397 A1* | 8/2008 | Atkinson | H04L 41/0856 709/221 |
| 2020/0143649 A1* | 5/2020 | Coonley | G08B 13/1672 |
| 2021/0212168 A1* | 7/2021 | Yoden | H04W 48/18 |
| 2021/0385359 A1* | 12/2021 | Reid | G03B 17/561 |

FOREIGN PATENT DOCUMENTS

| | | |
|---|---|---|
| KR | 10-1912235 B1 | 1/2019 |
| KR | 10-1952719 B1 | 2/2019 |
| KR | 10-1954059 B1 | 6/2019 |

OTHER PUBLICATIONS

Written Opinion dated Nov. 4, 2020 in counterpart International Application No. PCT/KR2020/009894 (4 pages in Korean).

* cited by examiner

AMPLIFIER-EMBEDDED VIDEO SURVEILLANCE IP SPEAKER SYSTEM

CROSS REFERENCE TO RELATED APPLICATION(S)

This application claims the benefit under 35 USC § 119(a) of Korean Patent Application No. 10-2020-0001489, filed on Jan. 6, 2020, in the Korean Intellectual Property Office, the entire disclosure of which is incorporated herein by reference for all purposes.

BACKGROUND OF THE INVENTION

1. Field of the Invention

The present disclosure relates to an amplifier-embedded video surveillance IP speaker system, and more particularly, to an amplifier-embedded video surveillance IP speaker system including an IP video device, an IP audio device, and a sensor.

2. Description of the Prior Art

A speaker is an acoustic device that converts an electric signal into vibration of a diaphragm to generate waves of high and low air pressure and radiates audio waves, thereby outputting an acoustic signal, and is also called a "loudspeaker".

Speakers are classified into cone-type speakers, acme-type speakers, and horn-type speakers, in which a horn is provided in front of a diaphragm according to the structure thereof.

In stereo radio devices, most radiation-type speakers, in which a diaphragm is directly exposed to the air, employ a cone speaker.

The cone speaker mostly uses a cone plate as a diaphragm, and is configured as a coin type rather than a magnetic speaker in an electromagnetic type (magnetic loudspeaker). Since the efficiency of a speaker is proportional to the square of the total number of magnetic fluxes passing through the coil, a large-diameter speaker using a large magnet has good electro-acoustic conversion efficiency.

A speaker (loudspeaker) is manufactured by combining a low-pitched audio unit (e.g., a woofer) (20 to 100 Hz), a middle-pitched audio unit (e.g., a squawker) (100 to 1,000 Hz), and a high-pitched audio unit (e.g., a tweeter) (1,000 Hz to 10 kHz) according to audio frequency bands, and a basic speaker system includes an audio signal processing system, a power amplifier (AMP), and speakers (L and R).

A full-range speaker for reproducing a low-pitched sound to a high-pitched sound in the audible frequency band (20 to 20,000 Hz) has a woofer for reproducing a low-pitched sound in a band of 20 to 100 Hz, a squawker for reproducing a sound in the mid-range of hundreds to thousands of Hz, and a tweeter for reproducing a high-pitched sound in a band of thousands of Hz to 20 kHz.

The speaker reproduces sound in a band of 100 to 8000 Hz and reproduces music in a band of 30 to 15,000 Hz in consideration of output and directivity characteristics according to the sound pressure level (SPL), frequency characteristics, and the audio characteristics of a space depending on a directivity angle.

Sound pressure refers to a difference in air pressure from atmospheric pressure (1 atmosphere=1,013 mbar). The minimum audible sound with respect to the minimum audible value p0=2×10$^{-4}$ μbar of a plane wave sound of 1 kHz, based on normal human hearing, is called "reference audio pressure".

Sound pressure level$^{SPL=20\ log_{10}(P/Po)}$ [dB]

Here, Po is the reference sound pressure (2*10 μbar), and P is the sound pressure to be measured. The sound pressure level is expressed in decibels (dB).

In Prior Art 1 related to the above description, Korean Patent Registration No. 10-1928561 discloses "IP speaker system equipped with rechargeable power supply and amplifier using POE type".

FIG. 1 is a diagram illustrating the configuration of the IP speaker system equipped with a rechargeable power supply and an amplifier using a POE (Power over Ethernet) type.

The IP speaker system equipped with a rechargeable power supply and an amplifier using a POE (Power ever Ethernet) type includes an amplifier-embedded IP speaker 300 including a PoE-type charging system 303 connected using a USB cable to perform charging at a rated current and voltage, a PoE Ethernet module 302, a wireless communication unit (e.g., Wi-Fi or Bluetooth) 308 for receiving digital audio source data while interworking with a smart device, a CPU, a DSP, a volume control unit, and an equalizer control unit (e.g., an audio source control board) and having an IP address assigned thereto. The wireless communication unit 308 uses any one of Wi-Fi and Bluetooth, and the amplifier-embedded IP speaker includes a single speaker directly connected to an amplifier, or includes an amplifier and a speaker selector in the case where two or more speakers are provided, wherein the speaker selector is connected to the two or more speakers.

The amplifier-embedded IP speaker 300 receives, using the PoE Ethernet module, digital audio source data provided from an audio source server 200 through an IP network using TCP/IP or UDP/IP or through the Wi-Fi/Bluetooth wireless communication unit 308, thereby outputting the same from the amplifier-embedded IP speaker 300. The amplifier-embedded IP speaker 300 connected to a UTP cable (CAT5) line receives audio source signals, power, and control signals transmitted by a PoE method. If there is no audio source signal, the amplifier (AMP) operates in a standby mode to allow the battery to be charged with power, and if the reception of an audio source signal is identified by a monitoring module of the CPU, the charging system stops and the amplifier (Power Amp) is operated using the charged power and the transmitted power, thereby operating the speakers.

The PoE-type charging system is able to perform charging of DC 3 V to DC 48 V and supplies power of 10 W to 90 W to the amplifier (AMP) according thereto.

The amplifier-embedded IP speaker 300 includes: a PoE Ethernet module 302 for receiving digital audio data 301 from the audio source server 200 through an IP network; a PoE-type charging system 303 performing charging at a rated voltage and current using a USB cable; a DC-DC converter 304 connected to the PoE-type charging system 303 and converting a DC voltage into a predetermined DC voltage; an audio ADC 307 connected to the CPU 309 and converting an analog audio signal provided through an analog audio signal input unit into a digital audio signal, thereby providing the same; a CPU 309 for providing respective functions of charging the amplifier-embedded IP speaker and outputting an audio signal through the amplifier-embedded speaker; a DSP 310 connected to the CPU 309 and having a DSP program installed therein; a power-on/off button; a volume control unit 311 for adjusting a volume level; an equalizer control unit 312 for adjusting an equalizer level for each frequency band; an audio DAC 313 for converting a digital audio signal into an analog audio signal and providing the converted analog audio signal; an amplifier (AMP) 314 for amplifying an analog audio signal according to a preset volume level and equalizer level for each frequency band; and a speaker 317 connected to the amplifier (AMP) 314 and outputting an amplified analog audio signal, wherein the amplifier-embedded video IP speaker 300 has an IP address assigned thereto, receives digital audio source data provided from the audio source server 200 by the PoE Ethernet module 302 through an IP network, and outputs the some in real time through the CPU, the audio DAC, the amplifier, and the speaker according to the preset volume level and equalizer level for each frequency band.

The amplifier-embedded IP speaker 300 further includes a storage unit that is connected to the CPU 309 and buffers and stores digital audio source data through the PoE Ethernet module or the wireless communication unit (Wi-Fi or Bluetooth) connected to the IP network.

The amplifier-embedded IP speaker 300 further includes an LCD display unit 319 that is connected to the CPU 309 and outputs information on the reproduced digital audio source data, the volume level, and the equalizer frequency.

The amplifier-embedded IP speaker 300, having an IP address assigned thereto, may receive digital audio source data (digital audio source) from the audio source server 200 through the IP network using the PoE Ethernet module 302, and may output the same through the CPU 309, the audio DAC 313, the amplifier 314, and the speaker 317 according to a preset volume level and equalizer level for each frequency band.

The video system and the audio system are currently configured and used as separate devices. There is no existing speaker system equipped with an integrated device thereof.

Therefore, a single integrated piece of IP speaker equipment including an IP video device, an IP audio device, and a sensor is required.

SUMMARY OF THE INVENTION

In order to solve the above problem, an objective of the present disclosure is to provide a single integrated piece of IP speaker equipment that includes an IP video device having a camera, an IP audio device having a microphone, and a sensor. Another objective of the present disclosure is to provide an amplifier-embedded video surveillance IP speaker 700 that transmits a detection signal of a sensor and UDP/IP or RTP/UDP/IP video/audio packet data of a camera and a microphone to a remote user terminal through a PoE module or a Wi-Fi or LTE 4G/5G communication unit. In addition, another objective of the present disclosure is to provide an amplifier-embedded video surveillance IP speaker, including an IP video device, an IP audio device, and a sensor, in which a remote user terminal 900 monitors the state of the IP speaker, a sensor detection signal, and video/audio data, and transmits a remote control command to the amplifier-embedded video surveillance IP speaker so as to output a warning sound.

An embodiment of the present disclosure provides an amplifier-embedded video surveillance IP speaker system including: an amplifier-embedded video surveillance IP speaker that is one integrated IP speaker including an IP video device having a camera, an IP audio device having a microphone, and a sensor, transmits a detection signal of a sensor and UDP/IP or RTP/UDP/IP video/audio packet data of a camera and a microphone through a PoE module or a Wi-Fi or LTE 4G/5G communication unit to a remote user terminal, and has an IP address assigned thereto; and a user terminal that receives and stores a detection signal of the sensor and UDP/IP or RTP/UDP/IP video/audio packet data of the camera and the microphone from the amplifier-embedded video surveillance IP speaker, monitors the state of the IP speaker, a sensor detection signal, and video/audio data, and transmits a text message or audio data of the user terminal or transmits a remote control command to the amplifier-embedded video surveillance IP speaker in an emergency situation such as a fire, a water level rise, or the like or when an intrusion or unusual movement is detected, wherein at least one sensor is selectively mounted to the amplifier-embedded video surveillance IP speaker as necessary, and provides an intrusion detection signal using a motion detection sensor or an infrared sensor, a fire detection signal using a temperature sensor or a fire detection sensor, or a water level detection signal using a water level sensor for detecting the water level in the event of a typhoon or heavy rain/rainfall.

In addition, the amplifier-embedded video surveillance IP speaker according to the embodiment performs a power charging method in which control signals for a camera, an IP video device, a microphone, and an IP audio device are processed by a PoE (Power over Ethernet) method and has an IP address assigned thereto.

In addition, the amplifier-embedded video surveillance IP speaker according to the embodiment may include: a controller that performs control so as to charge the amplifier-embedded video surveillance IP speaker, transmit video/audio data of the camera/microphone and a detection signal of the sensor to the user terminal through a wired/wireless communication network, receive text transmitted from the remote user terminal in the case of detecting an emergency situation, and output audio data converted from the text by a TTS conversion module of the controller of the amplifier-embedded video surveillance IP speaker, output audio data transmitted from the remote user terminal to a speaker, or output a warning sound through an amplifier and a speaker according to a remote control command received from the remote user terminal; a digital signal processor that is connected to the controller, has an A/V codec, and includes a video processor for encoding/decoding video data and an audio processor for encoding/decoding audio data; a camera connected to the video processor of the digital signal processor; a speaker that is connected to the audio processor of the digital signal processor and has an embedded DAC for converting digital audio data into an analog audio signal and an embedded amplifier for amplifying the analog audio signal; a storage unit that is connected to the controller, temporarily stores a video input stream and an audio input stream, and stores a driving program and a warning sound; an ADC connected to the controller; at least one sensor connected to the controller and providing a detection signal thereof; and a PoE Ethernet module that is connected to the controller, transmits video/audio data of the camera/microphone and a detection signal of the sensor to the user terminal through an IP network, and receives a remote control command from the user terminal.

In addition, the amplifier-embedded video surveillance IP speaker according to the embodiment further includes a communication unit configured to transmit video/audio data of the camera/microphone and a detection signal of the sensor to the user terminal through a Wi-Fi or mobile communication network (LTE 4G/5G) and receive a remote control command from the user terminal, and the communication unit uses a Wi-Fi communication unit or an LTE 4G/5G communication unit.

In addition, the amplifier-embedded video surveillance IP speaker according to the embodiment is configured to transmit video/audio data of the camera/microphone and a detection signal of the sensor to the user terminal through a wired/wireless communication network and output a warning sound through the amplifier-embedded speaker according to a remote control command received from the user terminal when an emergency situation occurs or unusual movement is detected.

In addition, the amplifier-embedded video surveillance IP speaker according to the embodiment further includes an audio signal processor connected to the controller and processing an audio signal of a microphone, an ADC, and a microphone.

In addition, the amplifier-embedded video surveillance IP speaker according to the embodiment further includes a PoE-type charging system connected to the controller, including a DC-DC converter for converting a DC voltage into a predetermined DC voltage, and performing charging at a rated voltage and current using a USB cable.

In addition, the amplifier-embedded video surveillance IP speaker according to the embodiment is configured to control a network IP speaker using SIP or RTSP, which is a VoIP protocol, transmit audio data of the user terminal to the amplifier and the speaker in the network speaker using RTP/RTCP or secure RTP/RICP so as to output the same through the speaker in real time, receive and decode the UDP/IP-, RTP/UDP/IP-, or SRTP-based audio packet in real time, and output the decoded audio signal to the IP speaker.

In addition, the amplifier-embedded video surveillance IP speaker according to the embodiment stores audio source data on a warning sound in the storage unit of the amplifier-embedded video surveillance IP speaker, automatically broadcasts audio data of a monitor agent transmitted from the remote user terminal in the case of detecting an intrusion or fire, and outputs audio data, which is converted from the text transmitted from the remote user terminal to the amplifier-embedded video surveillance IP speaker through a wired/wireless communication network using a TTS conversion module of the controller of the amplifier-embedded video surveillance IP speaker, to the speaker, thereby enabling text broadcasting.

In addition, the controller of the amplifier-embedded video surveillance IP speaker according to the embodiment further includes: a TTS conversion module of the controller of the amplifier-embedded video surveillance IP speaker, which converts a text message transmitted from the remote user terminal into audio data and outputs the same; and a PTZ controller that controls the direction of the entire amplifier-embedded video surveillance IP speaker having a microphone and a camera embedded therein, and the controller performs control of transmission of a detection signal of the sensor and video/audio data to the user terminal, volume control, direction control, equalizer setting control, and output of a warning sound.

In addition, the user terminal according to the embodiment is connected to the amplifier-embedded video surveillance IP speakers through two separate networks (an IP network and Wi-Fi or LTE 4G/5G), instead of a single IP network, diagnoses the network states (the power-on/off state and the volume state) of the IP speakers for each speaker or each group thereof, and remotely controls the amplifier-embedded video surveillance IP speakers having IP addresses or device IDs assigned to each speaker or each group thereof.

An amplifier-embedded video surveillance IP speaker system including an IP video device, an IP audio device, and a sensor according to the present disclosure provides a single piece of integrated IP speaker equipment that includes an IP video device having a camera, an IP audio device having a microphone, and a sensor. The present disclosure provides an amplifier-embedded video surveillance IP speaker that transmits a detection signal of a sensor and UDP/IP or RTP/UDP/IP video/audio packet data of a camera and a microphone to a remote user terminal through a PoE module or a Wi-Fi or LTE 4G/5G communication unit.

The present disclosure has an effect in which a remote user terminal monitors the state of the IP speaker, a sensor detection signal, and video/audio data and in which a monitor agent using the remote user terminal transmits audio data to the amplifier-embedded video surveillance IP speaker having an IP address assigned thereto so as to output the same or transmits a remote control command to the amplifier-embedded video surveillance IP speaker so as to output a warning sound.

The amplifier-embedded video surveillance IP speaker is capable of controlling a network IP speaker using SIF or RTSP, which is a VoIP protocol, outputting audio data of a user terminal in real time from a speaker using a UDP/IP, RTP/RTCP, or secure RTP/RTCP protocol by transmitting the audio data to the IP speaker, and receiving and decoding a UDP/IP-, RTP-, or SRTP-based audio packet in real time and then outputting the same to the IP speaker.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION OF THE EXEMPLARY EMBODIMENTS

Hereinafter, the configuration and operation of the present disclosure according to preferred embodiments of the present disclosure will be described in detail with reference to the accompanying drawings. In the description of the present disclosure, if it is determined that detailed descriptions of related known functions or known configurations may unnecessarily obscure the subject, matter of the present disclosure, the detailed descriptions thereof will be omitted. In addition, the same elements will be denoted by the same reference numbers even if they are shown in different drawings.

Figure 1:
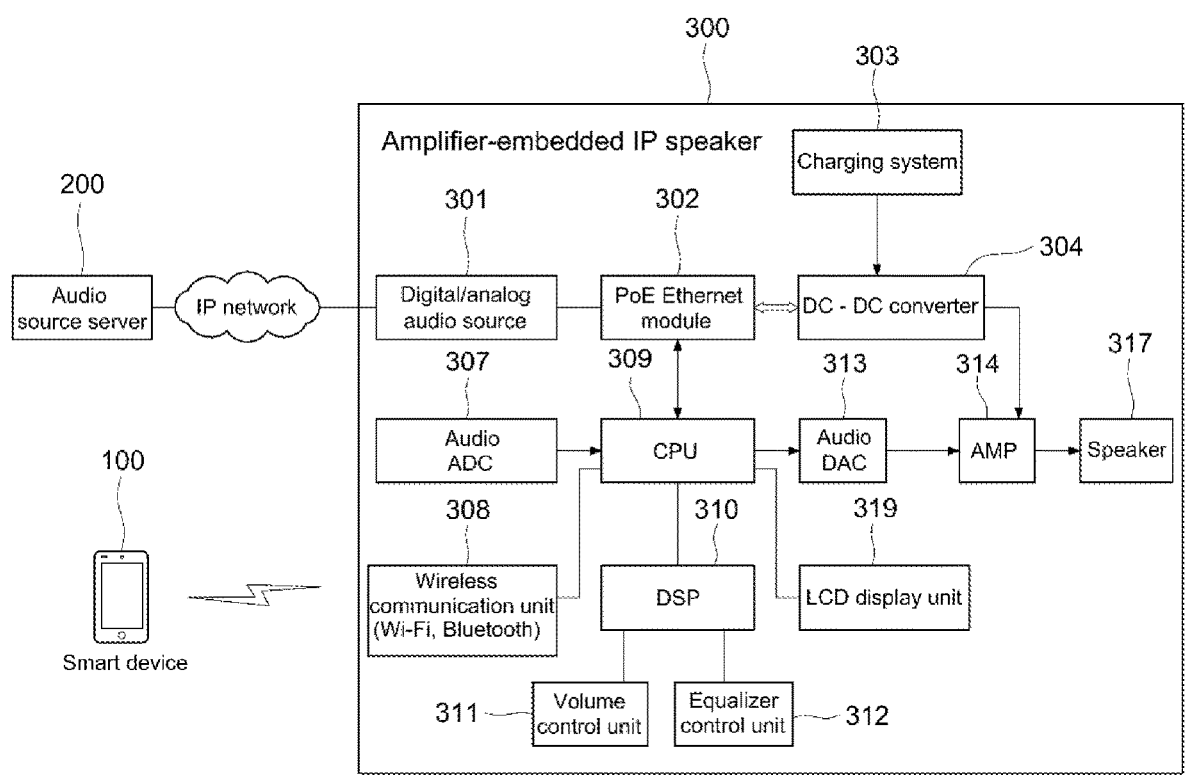
FIG. 1 is a diagram illustrating the configuration of an IP speaker system equipped with a rechargeable power supply and an amplifier using a POE (Power over Ethernet) type.
Figure 2:
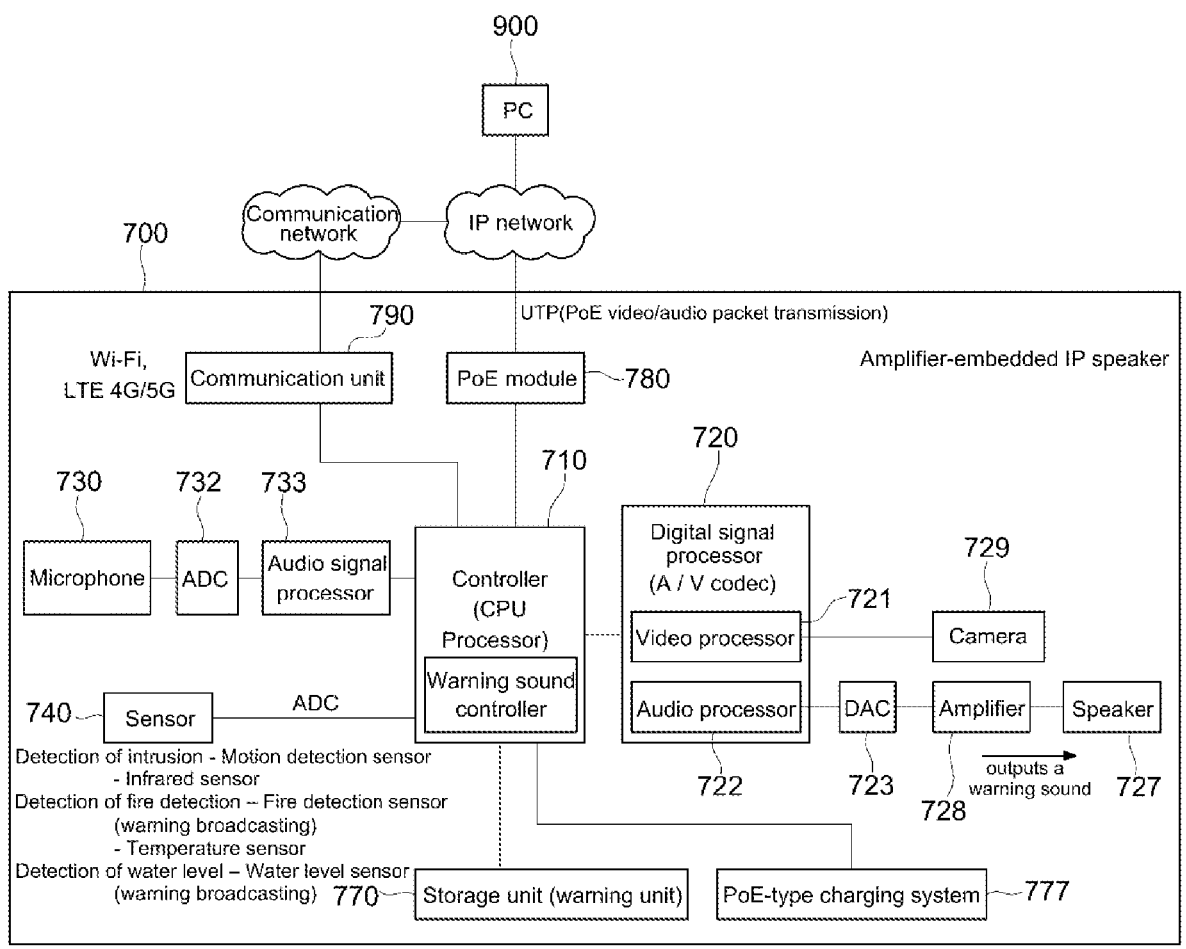
FIG. 2 is a diagram illustrating the configuration of an amplifier-embedded video surveillance IP speaker system having an IP video device, an audio device, and a sensor according to the present disclosure.

FIG. 2 is a diagram illustrating the configuration of an amplifier-embedded video surveillance IP speaker system having an IP video device, an audio device, and a sensor according to the present disclosure.

Figure 3:
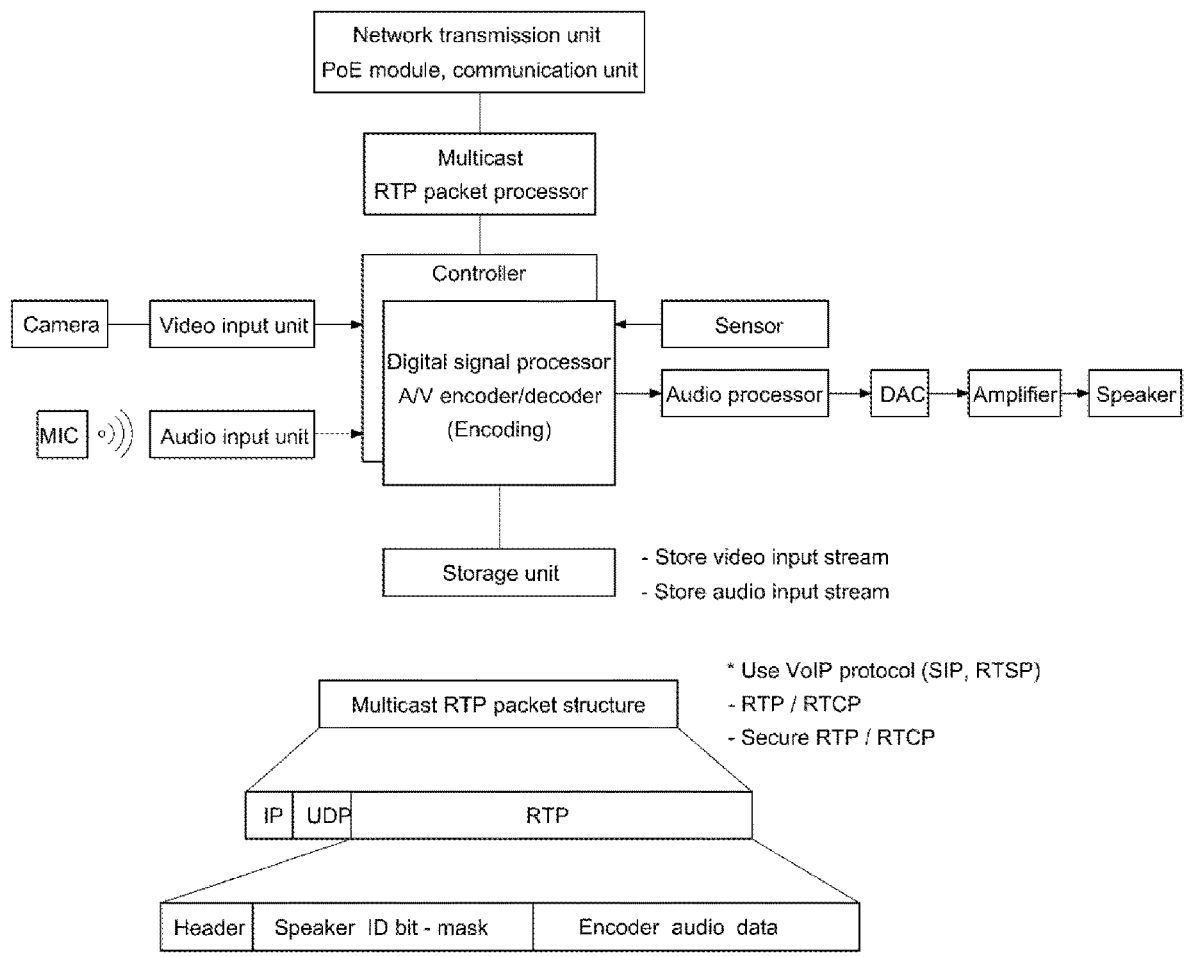
FIG. 3 is a conceptual diagram of an amplifier-embedded video surveillance IP speaker having an IP video device, an audio device, and a sensor, which transmits RTP/UDP/IP video/audio packet data.

FIG. 3 is a conceptual diagram of an amplifier-embedded video surveillance IP speaker having an IP video device, an audio device, and a sensor, which transmits RTP/UDP/IP video/audio packet data.

The present disclosure provides an amplifier-embedded video surveillance IP speaker that is a single integrated IP speaker including an IP video device having a camera, an IP audio device having a microphone, and a sensor, performs a power charging method in which control signals for a camera, an IP video device, a microphone, and an IP audio device are processed using a PoE (Power over Ethernet) method, and has an IP address assigned thereto.

The amplifier-embedded video surveillance IP speaker applies a PoE method to transmission of power and control signals, provides integrated equipment of an amplifier-embedded speaker, a microphone, and a camera, and utilizes the technology of existing patent "IP speaker system equipped with rechargeable power supply and amplifier using POE type" for supply of power required therefor.

A user terminal 900 is connected to the amplifier-embedded video surveillance IP speakers through two separate networks (an IP network and Wi-Fi or LTE 4G/5G), instead of a single IP network, diagnoses the network states (a power-on/off state, a volume state, and the like) of the IP speakers for each speaker or each group thereof, and remotely controls the amplifier-embedded video surveillance IP speakers having IP addresses or device IDs assigned to each speaker (unicast) or each group (multicast) thereof.

As shown in FIG. 3, the user terminal transmits device IDs and audio data of a plurality of amplifier-embedded video surveillance IP speakers for each group according to the IP/UDP/RTP multicast RTP packet structure.

(Fundamental Functions)

1. Remote Speaker Function

A function of diagnosing the network state of each speaker or each group of multiple speakers in remote places and the output state thereof A function of transmitting and receiving video signals by a PoE (Power over Ethernet) method to provide video information to remote places A speaker performs direct broadcasting using its own sensor, and a remote user terminal transmits a user's audio signal to the speaker, thereby performing broadcasting 2. Function of Transmitting Embedded Audio Source Data Have separate memory mounted thereto for storing embedded audio source data (at least 128 MB)

Warning broadcasting is directly performed in an external remote place on the basis of the monitored video content.

Emergency warning lights and emergency guidance lights are employed so that self-emergency and warning broadcasting is performed when its own sensor detects a danger signal.

3. Function of Storing System State History

Separate memory for storing broadcast output history, video information, and primary system state history is mounted thereto.

The amplifier-embedded video surveillance IP speaker is remotely controlled by a remote control center.

[Characteristics]

For example, a camera-integrated speaker product has a simpler line and easier facility management than existing products.

A power problem is solved by transmitting a video signal, an audio signal, and a control signal using PoE.

Existing products use separate video and audio products.

Integrated equipment of video equipment and audio equipment

Video data is usually transmitted to a remote place, and data of audio signals and sensors is stored in IP speaker equipment and is then transmitted to a remote place when an event occurs.

Audio transmission/control and video device control are performed in a remote place.

Audio and video data is monitored from a remote place.

Figure 4:
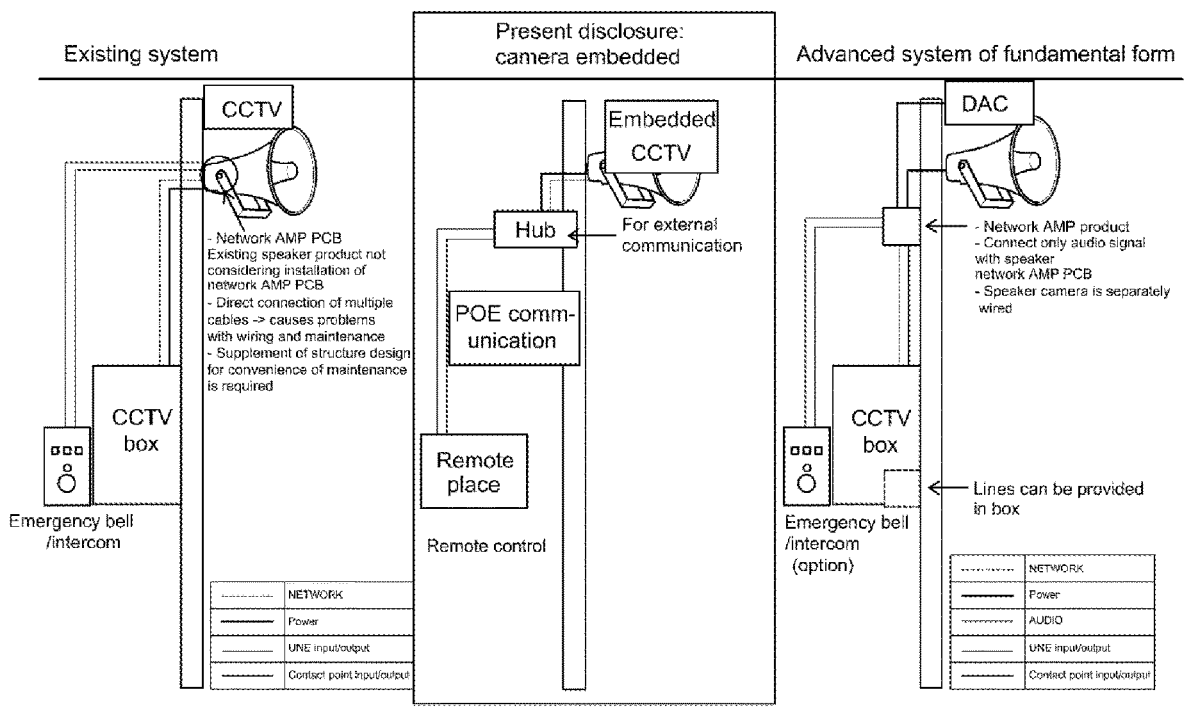
FIG. 4 a diagram illustrating the configuration of a camera-embedded IP speaker communicating with a remote user terminal over a PoE Ethernet line.

FIG. 4 a diagram illustrating the configuration of a camera-embedded IP speaker communicating with a remote user terminal through a PoE Ethernet line.

Figure 5:
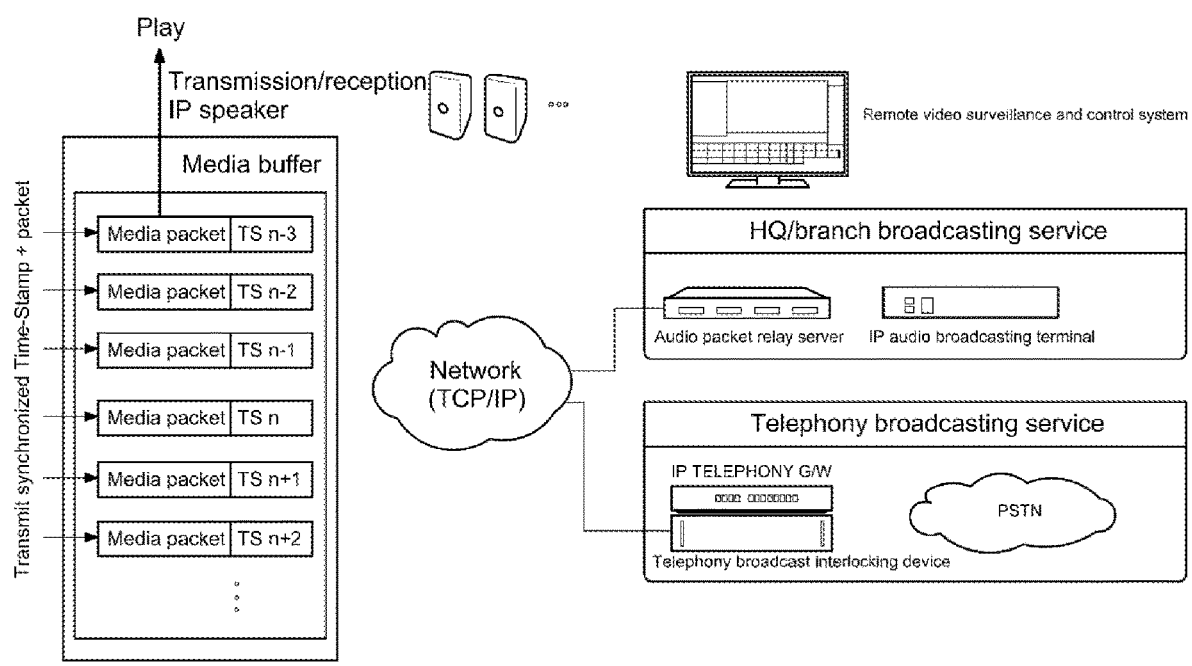
FIG. 5 is a conceptual diagram of a video surveillance broadcasting system using a UTP cable and transmission of a video packet and an audio packet using a single packet.

FIG. 5 is a conceptual diagram of a video surveillance broadcasting system using a UTP cable (CAT 5 or 6) and transmission of a video packet and an audio packet using a single packet.

An amplifier-embedded video surveillance IP speaker in which a video device and a speaker are integrated with each other A PoE (Power over Ethernet) type video surveillance IP speaker that transmits an audio signal and a video signal using a single packet with performance of a delay of less than 2 seconds in real time Compared to an existing system in which a network line, a control line, an audio line, a video line, and a power line are configured and separate equipment is provided, an IP speaker transmits data and power through a single POE line and performs the same functions as the above elements.

An IP speaker having an embedded BMS (Battery Management System) for controlling power of equipment An IP speaker that transmits video signals for remote monitoring and transmits audio data to a remote terminal user using a microphone embedded in an amplifier-embedded video surveillance IP speaker An amplifier-embedded video surveillance IP speaker stores audio source data on warning sounds in the storage unit provided therein. In the case of detecting an intrusion or fire, the remote user terminal transmits audio data of the monitor to the amplifier-embedded video surveillance IP speaker to automatically output and broadcast the same, and the amplifier-embedded video surveillance IP speaker outputs audio data converted from a text message, which is transmitted from the remote user terminal to the amplifier-embedded video surveillance IP speaker through a wired/wireless communication network, by a TTS conversion module of a controller, thereby enabling text broadcasting.

Control a network speaker using SIP or RTSP, which is a VoIP protocol

Volume control/ direction control using a PTZ controller of a camera, equalizer setting control, etc.

Audio data is transmitted from a user terminal to an amplifier-embedded video surveillance IP speaker through using UDP/IP, RTP/RTCP, or secure RTP/RTCP and is then output through a network speaker in real time.

Technique of receiving UDP/IP-, RTP-, or SRTP-based audio packets, decoding the same in real time, and outputting the decoded packets to an IP speaker In order to detect the output of on IP speaker to determine whether or not the speaker is operating normally, an audio input means such as a microphone is provided and the output of the speaker is measured, thereby providing related information (output volume, a relationship with the original sound, and the like) to a speaker management system.

In the case of detecting an intrusion, a motion of a person or the like is detected using a motion detection sensor (an IR sensor or a PIR sensor), and then a security warning sound is output using the audio source data stored in the internal storage unit of the amplifier-embedded video surveillance IP speaker.

In order to monitor the situation on the ground where an amplifier-embedded video surveillance IP speaker, which has an embedded camera/microphone, is installed, the audio data collected by a user terminal or a speaker management system of the control center from the amplifier-embedded video surveillance IP speaker is compressed using audio codecs such as MP3, MPEG AAC, or the like, and is transmitted in the reverse direction using RTP, SRTP, or UDP.

An amplifier-embedded video surveillance IP speaker of the present disclosure provides a single piece of integrated IP speaker equipment that includes an IP video device having a camera 729, an IP audio device having a microphone 730, and a sensor. The present disclosure provides an amplifier-embedded video surveillance IP speaker 700 that transmits a detection signal of a sensor and UDP/IP or RTP/UDP/IP video/audio packet data of a camera and a microphone to a remote user terminal 900 through a PoE module 780 or a Wi-Fi or LTE 4G/5G communication unit 790. The remote user terminal 900 monitors the state of the IP speaker, a sensor detection signal, and video/audio data, and transmits a remote control command to the amplifier-embedded video surveillance IP speaker 700 so as to output a warning sound.

The sensor 740 is mounted to the amplifier-embedded video surveillance IP speaker 700, and provides an intrusion detection signal using a motion detection sensor or an infrared sensor, a fire detection signal using a temperature sensor or a fire detection sensor, or a water level detection signal using a water level sensor for detecting the water level in the event of a typhoon or heavy rain/rainfall.

In an emergency situation such as a fire, a water level rise, or the like or when an intrusion or unusual movement is detected, the amplifier-embedded video surveillance IP speaker 700 receives a text message transmitted from the remote user terminal 900 through a wired/wireless communication network, and outputs audio data converted from the text by a TTS conversion module of the controller 710 in the amplifier-embedded video surveillance IP speaker 700, outputs audio data, which is transmitted from the remote user terminal 900 to the amplifier-embedded video surveillance IP speaker 700 through a wired/wireless communication network, to the speaker 727, or outputs a warning sound stored in the storage unit to the speaker 727 according to a remote control command transmitted from the remote user terminal 900 to the amplifier-embedded video surveillance IP speaker 700 through a wired/wireless communication network.

The amplifier-embedded video surveillance IP speaker 700 includes a controller 710, a digital signal processor 720 including a video processor 721 and an audio processor 722, a DAC 723, an amplifier 728, a speaker 727, a camera 729, a microphone 730, an ADC 732, an audio signal processor 733, a sensor 740, a storage unit 770, a PoE-type charging system 777, a PoE module 780, and a communication unit 790.

The amplifier-embedded video surveillance IP speaker system of the present disclosure includes: an amplifier-embedded video surveillance IP speaker 700 that is a single integrated IP speaker including an IP video device having a camera, an IP audio device having a microphone, and a sensor, has an IP address and a device ID of the amplifier-embedded video surveillance IP speaker assigned thereto, transmits a detection signal of a sensor and UDP/IP or RTP/UDP/IP video/audio packet data of a camera and a microphone through a PoE nodule or a Wi-Fi or LTE 4G/5G communication unit to a remote user terminal 900; and a user terminal 900 that receives and stores a detection signal of the sensor and UDP/IP or RTP/UDP/IP video/audio packet data of the camera and the microphone from the amplifier-embedded video surveillance IP speaker 700, monitors the state of the IP speaker, a sensor detection signal, and video/audio data, and transmits text or audio data of the user terminal to the amplifier-embedded video surveillance IP speaker 700 or transmits a remote control command to the amplifier-embedded video surveillance IP speaker 700 in an emergency situation such as a fire, a water level rise, or the like or when an intrusion or unusual movement is detected, wherein at least one sensor is selectively mounted to the amplifier-embedded video surveillance IP speaker 700 as necessary, and is configured to provide an intrusion detection signal using a motion detection sensor or an infrared sensor, a fire detection signal using a temperature sensor or a fire detection sensor, or a water level detection signal using a water level sensor for detecting the water level in the event of a typhoon or heavy rain/rainfall.

A computer, a notebook, a smartphone, and a tablet PC are used as the user terminal 900, and the user terminal 900 is connected to the amplifier-embedded video surveillance IP speaker 700 through a wired/wireless communication network, receives UDP/IP or RTP/UDF/IP video/audio packet data of the camera and the microphone and a sensor signal from the amplifier-embedded video surveillance IP speaker 700, and monitors the state of the IP speaker. In an emergency situation such as a fire, a water level rise, or the like or when an intrusion or unusual movement is detected, the amplifier-embedded video surveillance IP speaker 700 receives text transmitted from the remote user terminal 900 and outputs audio data converted from the text by a TTS conversion module of the controller 710 in the amplifier-embedded video surveillance IP speaker 700, outputs audio data transmitted from the remote user terminal 900 to the speaker 727, or outputs a warning sound through the amplifier-embedded video surveillance IP speaker 700 according to a remote control command received from the remote user terminal 900.

The amplifier-embedded video surveillance IP speaker 700 includes a controller 710, a digital signal processor 720 including a video processor 721 and an audio processor 722, a DAG 723, an amplifier 728, a speaker 727, a camera 729, a microphone 730, an ADC 732, an audio signal processor 733, a sensor 740, a storage unit 770, a PoE-type charging system 777, a PoE module 780, and a communication unit 790.

The amplifier-embedded video surveillance IP speaker 700 of the present disclosure includes: a controller (CPU) 710 that performs control so as to charge the amplifier-embedded video surveillance IP speaker 700, transmit video/audio data of the camera/microphone and a detection signal of the sensor to the user terminal 900 through a wired/wireless communication network, receive text transmitted from the remote user terminal 900 to the amplifier-embedded video surveillance IP speaker 700, having an IP address assigned thereto, through a wired/wireless communication network in an emergency situation, and output audio data converted from the text by a TTS conversion module of the controller 710 of the amplifier-embedded video surveillance IP speaker 700, output the audio data, which is transmitted from the remote user terminal 900 to the amplifier-embedded video surveillance IP speaker 700 through a wired/wireless communication network, to the speaker 727, or output a warning sound pre-stored in the storage unit to the speaker 727 according to a remote control command transmitted from the remote user terminal 900 to the amplifier-embedded video surveillance IP speaker 700 through a wired/wireless communication network; a digital signal processor 720 that is connected to the controller (CPU) 710, has an A/V codec, and includes a video processor 721 for encoding/decoding video data and an audio processor 722 for encoding/decoding audio data; a camera 729 connected to the video processor 721 of the digital signal processor 720; a speaker 727 connected to the audio processor 722 of the digital signal processor 720 and having an embedded DAC 723 for converting digital audio data into an analog audio signal and an embedded amplifier 728 for amplifying an analog audio signal; a storage unit 770 that is connected to the controller 710, temporarily stores a video input stream and an audio input stream and automatically erases the same in a predetermined time, and stores a driving program and a warning sound; an audio ACC 307 that is connected to the controller 710 and converts an analog signal provided through the analog audio signal input unit into a digital audio signal, thereby providing the digital audio signal; at least one sensor 740 that is connected to the controller 710 and provides a detection signal thereof; and a PoE Ethernet module 780 that is connected to the controller 710, transmits video/audio data of the camera/microphone and a detection signal of the sensor to the user terminal 900 through an IP network, and receives a remote control command from the user terminal 900.

In addition, the amplifier-embedded video surveillance IP speaker 700 further includes a communication unit 790 configured to transmit video/audio data of the camera/microphone and a detection signal of the sensor to the user terminal 900 through a Wi-Fi or mobile communication network (LTE 4G/5G) and receive a remote control command from the user terminal 900. The communication unit 790 uses a Wi-Fi communication unit or an LTE 4G/5G communication unit.

The controller 710 of the amplifier-embedded video surveillance IP speaker 700 further includes: a TTS (Text To Speech) conversion module, which is provided in the controller 710 of the amplifier-embedded video surveillance IP speaker 700 and which converts a text message transmitted from the remote user terminal 900 into audio data and outputs the same; and a PTZ controller that controls the direction of the entire amplifier-embedded video surveillance IP speaker having a microphone and a camera embedded therein. In addition, the controller 710 of the amplifier-embedded video surveillance IP speaker 700 further performs control of transmission of a detection signal of the sensor and UDP/IP or RTP/UDP/IP video/audio packet data of the camera and the microphone to the user terminal 900, volume control, direction control using the PTZ controller for controlling the entire IP speaker having a microphone and a camera embedded therein, equalizer setting control, and output of a warning sound.

The sensor 740 is mounted to the amplifier-embedded video surveillance IP speaker, provides an intrusion detection signal using a motion detection sensor or an infrared sensor, a fire detection signal using a temperature sensor or a fire detection sensor, or a water level detection signal using a water level sensor for detecting the water level in the event of a typhoon or heavy rain/rainfall. The amplifier-embedded video surveillance IP speaker 700 transmits video/audio data of the camera/microphone and s detection signal of the sensor to the user terminal 900 through a wired/wireless communication network, receives a text message transmitted from the remote user terminal 900 to the amplifier-embedded video surveillance IP speaker 700 through a wired/wireless communication network in an emergency situation such as a fire, a water level rise, or the like or when an intrusion or unusual movement is detected, and outputs audio data converted from the text by a TTS conversion module of the controller 710 of the amplifier-embedded video surveillance IP speaker 700, outputs the audio data, which is transmitted from the remote user terminal 900 to the amplifier-embedded video surveillance IP speaker 700 through a wired/wireless communication network, to the speaker 727, or outputs a warning sound to the speaker 727 according to a remote control command transmitted from the remote user terminal 900 to the amplifier-embedded video surveillance IP speaker 700.

The amplifier-embedded video surveillance IP speaker 700 further includes an audio signal processor 733, which is connected to the controller 710 and processes an audio signal of a microphone, an ADC 732, and a microphone 730.

In addition, the amplifier-embedded video surveillance IP speaker 700 further includes a PoE-type charging system 303 connected to the controller 710, including a DC-DC converter for converting a DC voltage into a predetermined DC voltage, and performing charging at a rated voltage and current using a USB cable.

In addition, the amplifier-embedded video surveillance IP speaker 700 may further include a power-on/off button, and a volume control unit connected to the controller so as to adjust a volume level.

In addition, the amplifier-embedded video surveillance IP speaker 700 may further include an equalizer control unit that is connected to the controller and adjusts an equalizer level for each frequency band.

The user terminal 900 is connected to the amplifier-embedded video surveillance IP speakers 700 via two separate networks (an IP network and Wi-Fi or LTE 4G/5G), instead of a single IP network, diagnoses the network states (the power-on/off state and the volume state) of the amplifier-embedded video surveillance IP speakers for each speaker or each group thereof, and remotely controls the amplifier-embedded video surveillance IP speakers having IP addresses or device IDs assigned to each speaker or each group thereof.

That is, in an emergency situation such as a fire, a water level rise, or the like or when an intrusion or unusual movement is detected, the amplifier-embedded video surveillance IP speaker 700 receives text transmitted from the remote user terminal 900 to the amplifier-embedded video surveillance IP speaker 700 through a wired/wireless communication network and outputs audio data converted from the text by a TTS conversion module of the controller 710 of the amplifier-embedded video surveillance IP speaker 700, outputs audio data, which is transmitted from the remote user terminal 900, to the speaker 727, or outputs a warning sound stored in the storage unit 770 to the speaker 727 according to a remote control command transmitted from the remote user terminal 900 to the amplifier-embedded video surveillance IP speaker 700 through a wired/wireless communication network.

Referring to FIG. 3, the amplifier-embedded video surveillance IP speaker including an IP video device, an IP audio device, and a sensor, which transmits RTP/UDF/IP video/audio packet data, provides a single piece of integrated IP speaker equipment including an IP video device having a camera, an IP audio device having a microphone, and a sensor.

The amplifier-embedded video surveillance IP speaker 700 provides a single piece of integrated IP speaker equipment including an IP video device having a camera 729, an IP audio device having a microphone 730, and a sensor. The amplifier-embedded video surveillance IP speaker 700 transmits a detection signal of the sensor and RTP/UDF/IP video/audio packet data of the camera and the microphone to the remote user terminal 900 through the PoE module 780 or the Wi-Fi or LTE 4G/5G communication unit 790, and the remote user terminal 900 monitors the state of the IP speaker, a sensor detection signal, and video/audio data. In an emergency situation such as a fire, a water level rise, or the like or when an intrusion or unusual movement is detected, the amplifier-embedded video surveillance IP speaker 700 outputs audio data converted from the text, which is transmitted from the remote user terminal 900 to the amplifier-embedded video surveillance IP speaker 700 through a wired/wireless communication network, by a TTS conversion module of the controller 710 of the amplifier-embedded video surveillance IP speaker 700, outputs audio data, which is transmitted from the remote user terminal 900, to the speaker 727, or outputs a warning sound stored in the storage unit 770 to the speaker 727 according to a remote control command transmitted from the remote user terminal 900 to the amplifier-embedded video surveillance IP speaker 700 through a wired/wireless communication network.

An IP camera having a PoE interface providing L2 network functions such as scheduling of the PoE (Power ever Ethernet) operations, and a wireless AP (access point) are provided.

The sensor 740 mounted to the amplifier-embedded video surveillance IP speaker 700 provides an intrusion detection signal using a motion detection sensor or an infrared sensor, a fire detection signal using a temperature sensor or a fire detection sensor, or a water level detection signal using a water level sensor for detecting the water level in the event of a typhoon or heavy rain/rainfall. In an emergency situation such as a fire, a water level rise, or the like or when an intrusion or unusual movement is detected, the amplifier-embedded video surveillance IP speaker 700 outputs audio data converted from the text message, which is transmitted from the remote user terminal 900 to the amplifier-embedded video surveillance IP speaker 700 through a wired/wireless communication network, by a TTS conversion module of the controller 710 of the amplifier-embedded video surveillance IP speaker 700, outputs the audio data, which is transmitted from the remote user terminal 900 to the amplifier-embedded video surveillance IP speaker 700 through a wired/wireless communication network, to the speaker 727, or outputs a warning sound stored in the storage unit of the amplifier-embedded video surveillance IP speaker 700 according to a remote control command transmitted from the remote user terminal 900 to the amplifier-embedded video surveillance IP speaker 700.

The amplifier-embedded video surveillance IP speaker 700 controls a network IP speaker using SIP or RTSP, which is a VoIP protocol, transmits audio data of the user terminal to the amplifier and the speaker in the network speaker using RTP/RTCP or secure RTP/RTCP protocol so as to output the same through the speaker in real time, receives and decodes a UDP/IP-, RTP-, or SRTP-based audio packet in real time, and outputs the decoded audio signal to the IP speaker.

RTP (real-time transport protocol) is a session layer protocol for transmitting and receiving audio/video packet data (media packet data) in real time along with RTCP (RTP control protocol) defined in IETF RFC 1889 and 1890, and RTP packets are transmitted and received through a UDP/IP socket in the Ethernet LAN or Wi-Fi WLAN data link layer. A sender may give up a packet having a large packet delay by taking synchronized playback synchronization based on a timestamp. In addition, a receiver may check the transmission packet delay or bandwidth, and may transmit a notification to the upper layer application of the sender using RTCP to adjust an encoding rate, thereby implementing control of quality of service (QoS).

RTP supports unicasting or multicasting. An RTCP monitor extracts QoS values related to packet loss, jitter, and a round trip delay by monitoring RTP packets and uses a timestamp scheme in order to sort the sequence of irregularly received data. RTP/RTCP may support synchronized playback and security, and since the operation of RTP/RTCP protocol uses ALF (Application Level Framing) implemented in the form of a library of application programs, it is possible to adjust the individual size of a transmission buffer/reception buffer located inside the protocol for each application.

Figure 6:
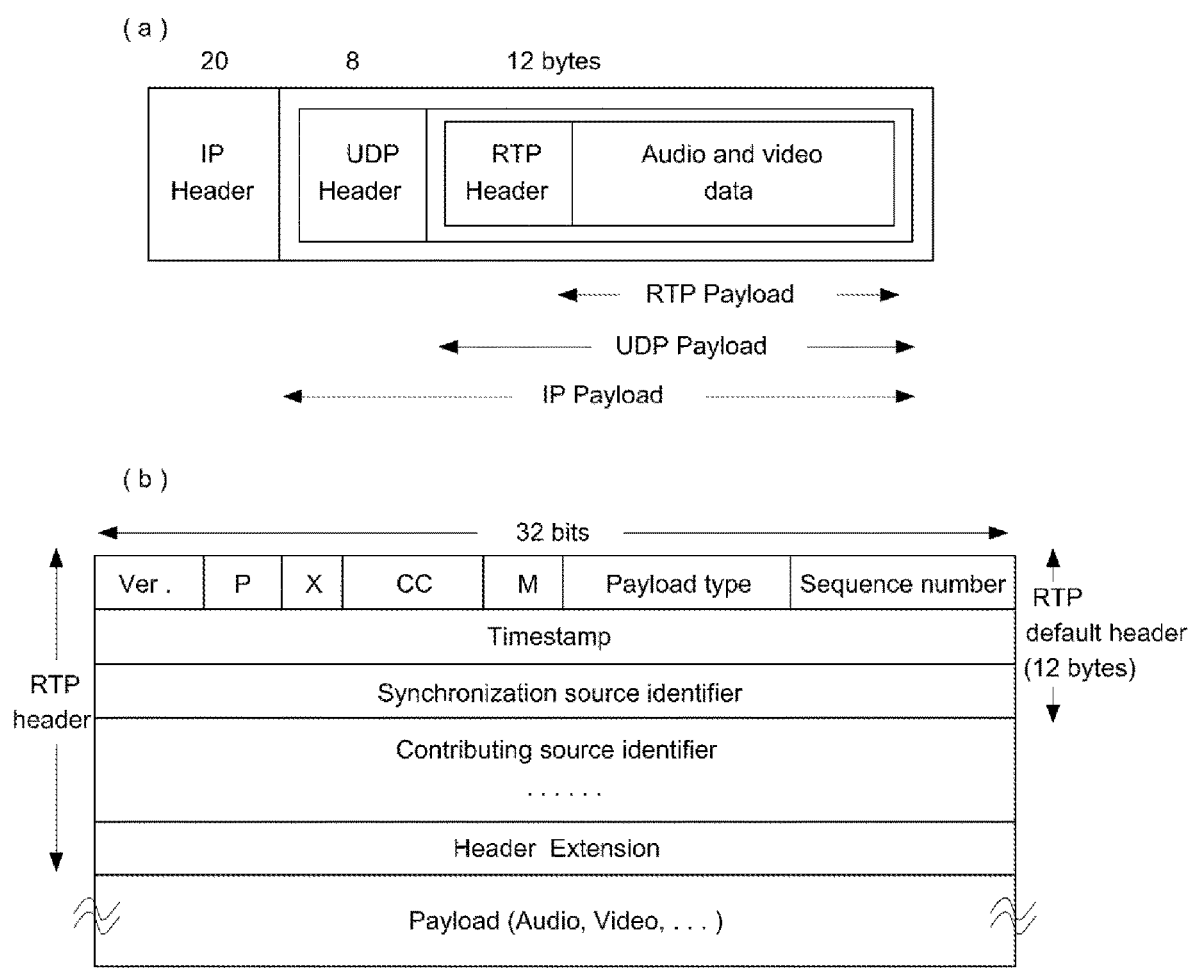
FIG. 6 is a diagram illustrating an example of the structures of IP/UDP/RTP/video and audio data and an RTF packet of an RTF media packet transmission protocol for transmitting video/audio packet data.

FIG. 6 is a diagram illustrating the structures of IP/UDP/RTP/video and audio data and an RTP packet of an RTP media packet transmission protocol for transmitting video/audio packet data.

An RTP session is a logical one-way connection session established between the sender and the receiver through an RTP protocol. In the RTP session, the destination is identified by one IP address and a pair of RTP/RTCP numbers, and a unicast address or multicast addresses may be used as the IP address.

RTP is a media packet transmission protocol, and is comprised of a 20-byte IP header, an 8-byte UDP header, a 12-byte RTP header, and an RTP payload (audio and video data) in IP/UDP for transmitting video and audio packet data. The UDP payload is comprised of a 12-byte RTP header and an RTP payload (audio and video data).

The RTP packet is comprised of an RTP header and an RTP payload, and the RTP payload includes video and audio data.

Respective fields in the structure of the RTP packet are described below.

Control bits: 16 bits
    Ver (version): 2 bits
    P (padding): 1 bit

If this is 1, there is padding data added to the end of the actual payload.

An application program configures an RTP packet payload in units of 32-bit integer multiples.

X (extension): 1 bit
   If this is 1, there is a variable-length extension header.

CC (CSRC Count): 4 bits
   The number of CSRC (Contributing Source) IDs immediately following a default header
   If multiple media are synthesized, the number thereof is indicated as CC, and it is indicated by an SRRC ID in order to make synchronization of reference for all.

M (Marker): 1 bit
   This notifies that an event occurs,

Payload type: (7 bits) Audio/video codec type
   Audio type number/
      0→G.711 AUDIO/PCMU (u-law audio), sampling frequency of 8000 Hz
      3→GSM, sampling frequency of 8000 Hz
      4→G.723, sampling frequency of 8000 Hz
      6→DVI4 (ADPCM), sampling frequency of 16000 Hz
      7→LPC, sampling frequency of 8000 Hz
      8→G.711 PCM(A-Law), sampling frequency of 8000 Hz
      9→G.722, sampling frequency of 8000 Hz
      12→Audio/QCELP, PureVoice QCELP audio
      14→Audio/MPEG audio, sampling frequency of 90000 Hz
      15→G.728, sampling frequency of 8000 Hz
   Video type number
      26→Video JPEG, Motion JPEG video
      31→Video/H.261, H.261 video
      32→Video/MPEG video, MPEG I/II video
      33→MPEG-2 TS Others may be arbitrarily specified (dynamic payload type): 96 to 127
   Standard list of payload types in RTP (IANA RTP parameters)
   RFC 3551—Describe method of encoding audio/video signals and sampling frequency Sequence Number: (16 bits)
   Packet loss detection and reordering
      The initial value of the sequence number is randomly determined, and the sequence number increases by 1 for every packet.
         The receiver detects packet loss and recovers the reverse order, rather than requesting packet retransmission.

Timestamp: (32 bits)
   This indicates a time relationship in which each RTP packet is sampled in the RTP stream.
      This starts from a random initial value, and is usually increased by 1 using a counter.
   The interval of the timestamp is based on the sampling interval determined according to the payload type.
      For most audio RTP packets
         =≥Set the default time interval per packet to 20 ms
      ex) G.711 (PCM A-Law) audio payload packet size
         =(Payload codec data rate)×(time interval per packet)
         =(64 kbps G.711 codec)×(20 ms)
         =(8000 samples×8 bits)/sec×(0.02 sec)
         =160 bytes Differences in timestamp value continuity
   Example 1) In the case where timestamp values of a series of packets are "the same",
      this means that a specific video scene is sampled at the same time.
   Example 2) In the case where timestamp values of a series of packets "does not simply increase",
      this means that the temporal sequence is shifted like an MPEG screen picture and prediction is performed based on previous and subsequent screens.
   Example 3) Timestamp values of a series of packets have a sequence in which the numbers "continuously increase".
      Audio packet flow, etc.

Synchronization source ID (SSRC ID): (32 bits)
   This is a unique number for identifying the original source (original information stream) in the RTP session.
      Each destination is indicated by a randomly selected SSRC ID in one RTP session.

Contributor source ID (CSRC ID) list: (32 bits)
   If multiple media are mixed, the total number is specified in CC (CSRC Count: 4 bits).
   In addition to SSRC, identifiers for added streams are used as CSRC ID values.
   If there is only one media source,
      CC−1, and the length of the RTP header is 12 bytes (default header length)
      Eventually, the SSRC ID has one value, and the CSRC ID list is empty.

RTP packet extension header: optional
RTP payload (audio and video data)
   The RTP packet is divided into an RTP header and an RTP payload (video and audio data).

Figure 7:
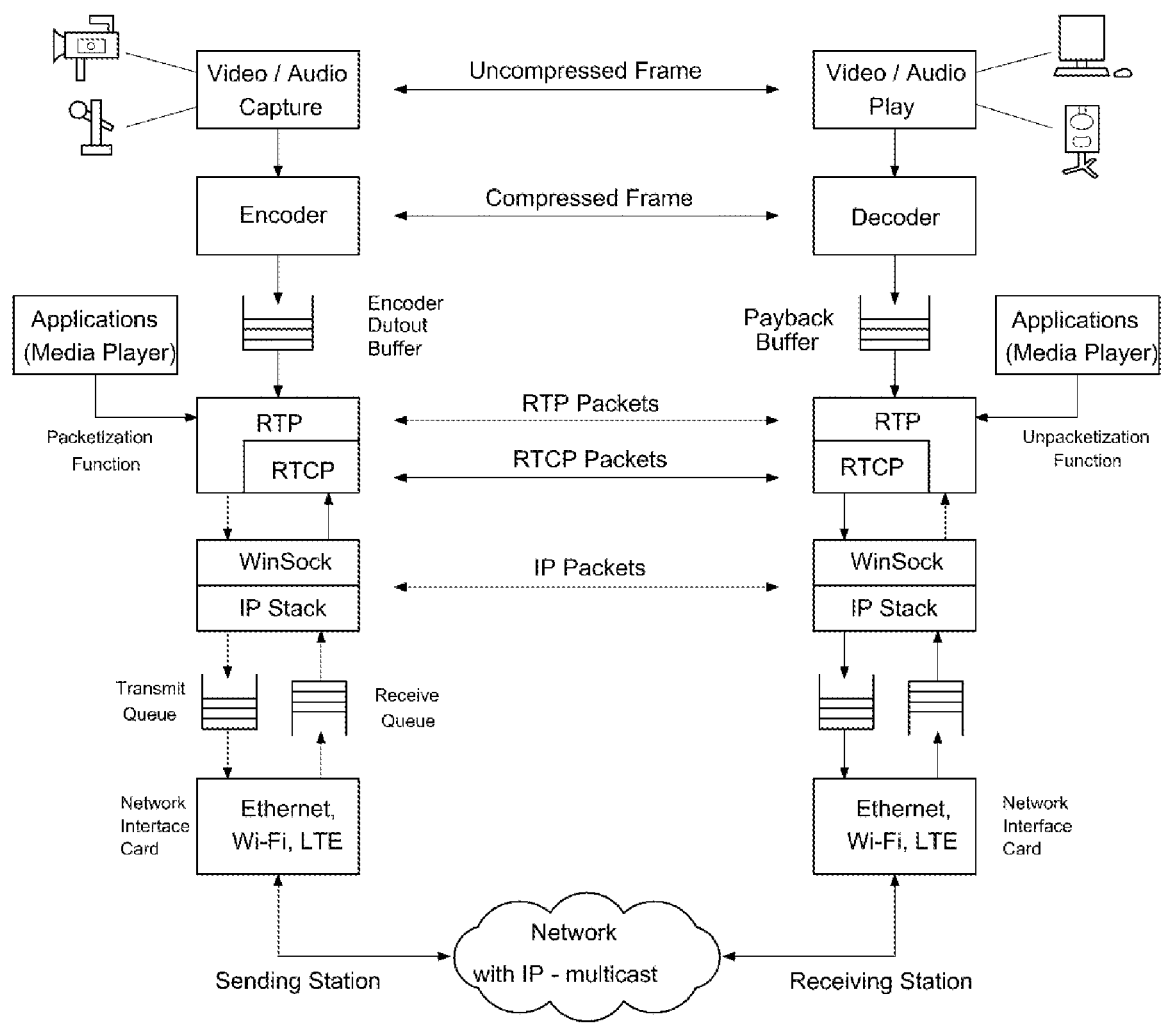
FIG. 7 is a diagram illustrating an example of a data flow for transmitting RTP/UDP/IP video/audio packet data between a sender and a receiver.

FIG. 7 is a diagram illustrating data flow for transmitting RTP/UDP/IP video/audio packet data between a sender and a receiver.

The operation includes a step of A/V-encoding video data and audio data of a camera and a microphone, respectively, using an encoder of an A/V codec and storing the same in a send buffer; a step of transmitting sensor detection data and RTP/UDP/IP video/audio packet data from the sender to the receiver using RTP/RTCP protocol through a socket and a wired/wireless communication network (e.g., Ethernet, Wi-Fi, or LTE 4G/5G); and a step of storing the data in a receive buffer of the receiver, A/V-decoding the data using a decoder of an A/V codec, and outputting video, audio, and sensor data to a video/audio player of a user terminal.

Go-Back-N transmits multiple frames (RTP/UDP/IP video/audio packet data) with a sequence number, and the receiver transmits ACK or MACK to the sender according to the sequence number. In the case of NAK, retransmission is performed from the frame of the number corresponding thereto.

The RTP packet header indicates the sample time, and the delay time may be calculated in consideration of the arrival time at the receiver, and is then recorded in a timestamp field.

In an emergency situation such as a fire, a water level rise, or the like or when an intrusion or unusual movement is detected, the amplifier-embedded video surveillance IP speaker 700 outputs audio data converted from the text message, which is transmitted from the remote user terminal 900 to the amplifier-embedded video surveillance IP speaker 700 through a wired/wireless communication network, by a TTS conversion module of the controller 710 of the amplifier-embedded video surveillance IP speaker 700, outputs audio data, which is transmitted from the remote user terminal 900 to the amplifier-embedded video surveillance IP speaker 700 through a wired/wireless communication network, to the speaker 727, or outputs a warning sound stored in the storage unit of the amplifier-embedded video surveillance IP speaker 700 according to a remote control command transmitted from the remote user terminal 900 to the amplifier-embedded video surveillance IP speaker 700.

In addition, it is possible to implement the present disclosure using a VoIP protocol. In this case, a step of registering a user agent (DA) SIP URL when performing VoIP signaling using a VoIP protocol SIP (Session Initiation Protocol), a step of setting up an SIP call; a step of transmitting and receiving RTF video/audio data (media data) between the UAC and the UAS through UDP/IP using an RTP packet of VoIP audio packet data after setting up the SIP call; and a step of releasing the SIP call setup are further included.

Although the present disclosure has been described above with reference to a specific embodiment thereof, the present disclosure is not limited to the configuration and operation shown in the specific embodiment illustrating the technical idea of the present disclosure described above, and may be modified and implemented in various ways without departing from the technical idea and scope of the present disclosure. Therefore, such modifications of the present disclosure shall fall within the scope of the present disclosure, and the scope of the present disclosure should be determined by the claims set forth below.

What is claimed is:

1. An amplifier-embedded video surveillance IP speaker system comprising:
    an amplifier-embedded video surveillance IP speaker that is a single integrated IP speaker comprising an IP video device having a camera, an IP audio device having a microphone, and a sensor, transmits a detection signal of a sensor and UDP/IP or RTP/UDP/IP video/audio packet data of a camera and a microphone through a PoE module or a Wi-Fi or LTE 4G/5G communication unit to a remote user terminal, and has an IP address assigned thereto; and
    a user terminal that receives and stores a detection signal of the sensor and UDP/IP or RTP/UDP/IP video/audio packet data of the camera and the microphone from the amplifier-embedded video surveillance IP speaker, monitors the state of the IP speaker, a sensor detection signal, and video/audio data, and transmits a text message or audio data of the user terminal or transmits a remote control in command to the amplifier-embedded video surveillance IP speaker in an emergency situation such as a fire, a water level rise, or the like or when an intrusion or unusual movement is detected,
    wherein at least one sensor is selectively mounted to the amplifier-embedded video surveillance IP speaker as necessary, and is configured to provide an intrusion detection signal using a motion detection sensor or an infrared sensor, a fire detection signal using a temperature sensor or a fire detection sensor, or a water level detection signal using a water level sensor for detecting the water level in the event of a typhoon or heavy rain/rainfall.

2. The amplifier-embedded video surveillance IP speaker system of claim 1, wherein the amplifier-embedded video surveillance IP speaker performs a power charging method in which control signals for the camera, the IP video device, the microphone, and the IP audio device are processed using a PoE (Power over Ethernet) method, and has an IP address assigned thereto.

3. The amplifier-embedded video surveillance IP speaker system of claim 1, wherein the amplifier-embedded video surveillance IP speaker comprises:
    a controller that performs control so as to charge the amplifier-embedded video surveillance IP speaker, transmit video/audio data of the camera/microphone and a detection signal of the sensor to the user terminal through a wired/wireless communication network, receive text transmitted from the remote user terminal in the case of detecting an emergency situation, and output audio data converted from the text by a TTS conversion module of the controller of the amplifier-embedded video surveillance IP speaker, output audio data transmitted from the remote user terminal to a speaker, or output a warning sound through an amplifier and a speaker according to a remote control command received from the remote user terminal;
    a digital signal processor that is connected to the controller, has an A/V codec, and comprises a video processor for encoding/decoding video data and an audio processor for encoding/decoding audio data;
    a camera connected to the video processor of the digital signal processor;
    a speaker that is connected to the audio processor of the digital signal processor and has an embedded DAC for converting digital audio data into an analog audio signal and an embedded amplifier for amplifying the analog audio signal;
    a storage unit that is connected to the controller, temporarily stores a video input stream and an audio input stream, and stores a driving program and a warning sound;
    an ADC connected to the controller;
    at least one sensor that is connected to the controller and provides a detection signal thereof; and
    a PoE Ethernet module that is connected to the controller, transmits video/audio data of the camera/microphone and a detection signal of the sensor to the user terminal through an IP network, and receives a remote control command from the user terminal.

4. The amplifier-embedded video surveillance IP speaker system of claim 1, wherein the amplifier-embedded video surveillance IP speaker further comprises a communication unit configured to transmit video/audio data of the camera/microphone and a detection signal of the sensor to the user terminal through a Wi-Fi or mobile communication network (LTE 4G/5G) and receive a remote control command from the user terminal, and
    wherein the communication unit uses a Wi-Fi communication unit or an LTE 4G/5G communication unit.

5. The amplifier-embedded video surveillance IP speaker system of claim 3, wherein the amplifier-embedded video surveillance IP speaker is configured to transmit video/audio data of the camera/microphone and a detection signal of the sensor to the user terminal through a wired/wireless communication network and output a warning sound through the amplifier-embedded speaker according to a remote control command received from the user terminal when an emergency situation occurs or when unusual movement is detected.

6. The amplifier-embedded video surveillance IP speaker system of claim 3, wherein the amplifier-embedded video surveillance IP speaker further comprises an audio signal processor connected to the controller and processing an audio signal of a microphone, an ADC, and a microphone.

7. The amplifier-embedded video surveillance IP speaker system of claim 3, wherein the amplifier-embedded video surveillance IP speaker further comprises a PoE-type charging system connected to the controller, comprising a DC-DC converter for converting a DC voltage into a predetermined DC voltage, and performing charging at a rated voltage and current using a USB cable.

8. The amplifier-embedded video surveillance IP speaker system of claim 1, wherein the amplifier-embedded video surveillance IP speaker is configured to control a network IP speaker using SIP or RTSP, which is a VoIP protocol, transmit audio data of the user terminal to the amplifier and the speaker in the network speaker using an RTP/RTCP or secure RTP/RTCP protocol so as to output the same through the speaker in real time, receive and decode a UDP/IP-, RTP/UDP/IP-, or SRTP-based audio packet in real time, and output the decoded audio signal to the IP speaker.

9. The amplifier-embedded video surveillance IP speaker system of claim 1, wherein the amplifier-embedded video surveillance IP speaker is configured to:
   store audio source data on a warning sound in the storage unit of the amplifier-embedded video surveillance IP speaker;
   automatically broadcast audio data of a monitor agent transmitted from the remote user terminal in the case of detecting an intrusion or fire; and
   output audio data, which is converted from the text transmitted from the remote user terminal to the amplifier-embedded video surveillance IP speaker through a wired/wireless communication network using a TTS conversion module of the controller of the amplifier-embedded video surveillance IP speaker, to a speaker, thereby enabling text broadcasting.

10. The amplifier-embedded video surveillance IP speaker system of claim 3, wherein the controller of the amplifier-embedded video surveillance IP speaker further comprises:
   a TTS conversion module of the controller of the amplifier-embedded video surveillance IP speaker, which converts a text message transmitted from the remote user terminal into audio data and outputs the same; and
   a PTZ controller that controls a direction of the entire amplifier-embedded video surveillance IP speaker having a microphone and a camera embedded therein, and
   performs control of transmission of the detection signal of the sensor and the video/audio data to the user terminal, volume control, direction control, equalizer setting control, and output of a warning sound.

11. The amplifier-embedded video surveillance IP speaker system of claim 1, wherein the user terminal is connected to the amplifier-embedded video surveillance IP speakers through two separate networks (an IP network and Wi-Fi or LTE 4G/5G), instead of a single IP network, diagnoses network states (the power-on/off state and the volume state) of the IP speakers for each speaker or each group thereof, and remotely controls the amplifier-embedded video surveillance IP speakers having IP addresses or device IDs assigned to each speaker or each group thereof.

* * * * *